(12) United States Patent  
Nagamine

(10) Patent No.: US 6,547,837 B2  
(45) Date of Patent: Apr. 15, 2003

(54) IC SOCKET

(75) Inventor: Hiroshi Nagamine, Miyazaki-ken (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/791,788

(22) Filed: Feb. 26, 2001

(65) Prior Publication Data

US 2002/0033522 A1 Mar. 21, 2002

(30) Foreign Application Priority Data

Sep. 19, 2000 (JP) ........................................ 2000-283857

(51) Int. Cl.⁷ ............................ H01L 21/00; H01L 21/64
(52) U.S. Cl. ...................................................... 29/25.01
(58) Field of Search ........................ 29/25.01; 324/755, 324/757, 762

(56) References Cited

U.S. PATENT DOCUMENTS

| 4,927,369 | A | * | 5/1990 | Grabbe et al. | ............... 324/755 |
| 5,159,266 | A | * | 10/1992 | Appold | ........................ 324/755 |
| 5,481,203 | A | * | 1/1996 | Appold | ........................ 324/537 |
| 5,742,171 | A | * | 4/1998 | Matsunaga et al. | ........... 439/66 |

* cited by examiner

Primary Examiner—David E. Graybill  
(74) Attorney, Agent, or Firm—Kanesaka & Takeuchi

(57) ABSTRACT

An IC socket comprises a socket body (13), a contact pin (14) with a contact portion (17) erected on the socket body (13) such that it is flexible toward the inside of the socket body (13), and a pressing member (15). The contact portion (17) has a contact face made by rounding a rectangular upper portion of the contact pin (14), thus minimizing an area of contact with the terminal (12) of a semiconductor package (11).

12 Claims, 7 Drawing Sheets

IC SOCKET

BACKGROUND OF THE INVENTION

1. Field of the Invention

The present invention relates to IC sockets.

2. Description of the Related Art

There has been proposed an IC socket having a plurality of contact pins for connection with the terminals of a semiconductor package to test the electrical characteristics of the semiconductor package.

FIG. 2 shows a first example of a conventional IC socket with a contact pin in contact with the terminal of a semiconductor package. FIG. 3 shows the contact pin of a second conventional IC socket in contact with the terminal of a semiconductor package.

In FIG. 2, a semiconductor package 51 has a plurality of terminals 52. An IC socket body 53 has the corresponding number of metal contact pins 54 to the number of the terminals 52. Each contact pin 54 is provided at a position corresponding to the position of each terminal 52 such that the contact portion 57 is brought into contact with the terminal 52 for connection to measuring equipment (not shown). A pressure member 55 is pressed downwardly by a pressing device (not shown) so as to press the terminal 52 against the contact portion 57. The contact pin 54 has a substantially U-shaped form to provide flexibility and is provided in a groove 56 of the socket body 53 so that the contact portion 57 is flexible downwardly.

Where a large amount of solder or dust particles (hereinafter "solder") is adhered to the back side of the terminal 52, the electrical contact between the terminal 52 and the contact pin 54 becomes so poor that it becomes defective. The dust particles are usually wastes of mold resins and fillers. An excessive amount of solder applied to the terminal 52 also causes poor contact. If there is a poor contact between the backside of the terminal 52 and the contact portion 57 of the contact pin 54, it is impossible to conduct appropriate test of the electrical characteristics of a semiconductor package.

Consequently, the contact portion 57 is provided with a first contact face 57a and a second contact face 57b so that when the terminal 52 is pressed against the contact pin 54, the first contact face 57a slides on the back side of the terminal 52 to wipe out the "solder" from the back side and then the second contact face 57b makes contact with the wiped and cleaned backside of the terminal 52. This makes a good electrical contact between the backside of the terminal 52 and the contact portion 57 of the contact pin 54.

In FIG. 3, the contact portion 57 of the contact pin 54 is provided with a plurality of triangular projections, forming a saw tooth configuration.

Similarly to the first example, when the terminal 52 is pressed against the contact portion 57 of the contact pin 54, the projections of the contact portion 57 wipe the backside of the terminal 52 to remove the "solder" from the backside so that the tips of the projections are brought into contact with the cleaned backside of the terminal 52. This makes a good electrical contact between the backside of the terminal 52 and the contact portion 57 of the contact pin 54. In addition, the "solder" removed from the backside is kept as remains 59 between the projections.

In the above IC sockets, however, the entire backside of the terminal 52 is wiped so that a large amount of "solder" is removed and scattered, contaminating the surrounding atmosphere. In the above second example, the "solder" is kept between the projections as remains 59 so that when the amount of the remains 59 becomes large, the remains 59 fall out and spread to contaminate the surrounding atmosphere.

If the surrounding atmosphere is contaminated, unexpected short-circuitry, etc. occurs, making it impossible to test the electrical characteristics of the semiconductor package. In addition, if the semiconductor package or manufacturing equipment is contaminated, the manufactured semiconductor package becomes defective, reducing the throughput or yield of the semiconductor manufacturing process.

If a large amount of "solder" accumulate on the contact portion 57 of the contact pin 54, the electrical contact between the backside of the terminal 52 and the contact portion 57 of the contact pin 54 is blocked. If the force to press the terminal 52 against the contact pin 54 is reduced so as to control the amount of "solder" removed by wiping, the contact pressure between the backside of the terminal 52 and the contact portion 57 of the contact pin 54 becomes too low to provide good contact. Where the "solder" adhered to the backside of the terminal 52 is waste of the mold resin or filler, the adhering power is so high that the waste is not removed by wiping. Consequently, the electrical contact between the backside of the terminal 52 and the contact portion 57 of the contact pin 54 is blocked.

SUMMARY OF THE INVENTION

Accordingly, it is an object of the invention to provide an IC socket capable of removing a small amount of "solder" without contaminating the surrounding atmosphere and eliminating poor contacts caused by an unsatisfactory contact pressure between the backside of the terminal 52 and the contact portion 57 of the contact pin 54 or remains of "solder" adhered to the backside of the terminal 52, thus making it possible to conduct appropriate test of the electrical characteristics of a semiconductor package.

According to the invention there is provided an IC socket which comprises a socket body and a contact pin with a contact face supported by the socket body such that it is flexible toward the inside of the socket body. The contact face is made by rounding an upper rectangular portion of the contact pin for contact with the terminal of a semiconductor package.

DESCRIPTION OF THE PREFERRED EMBODIMENTS

Figure 1:
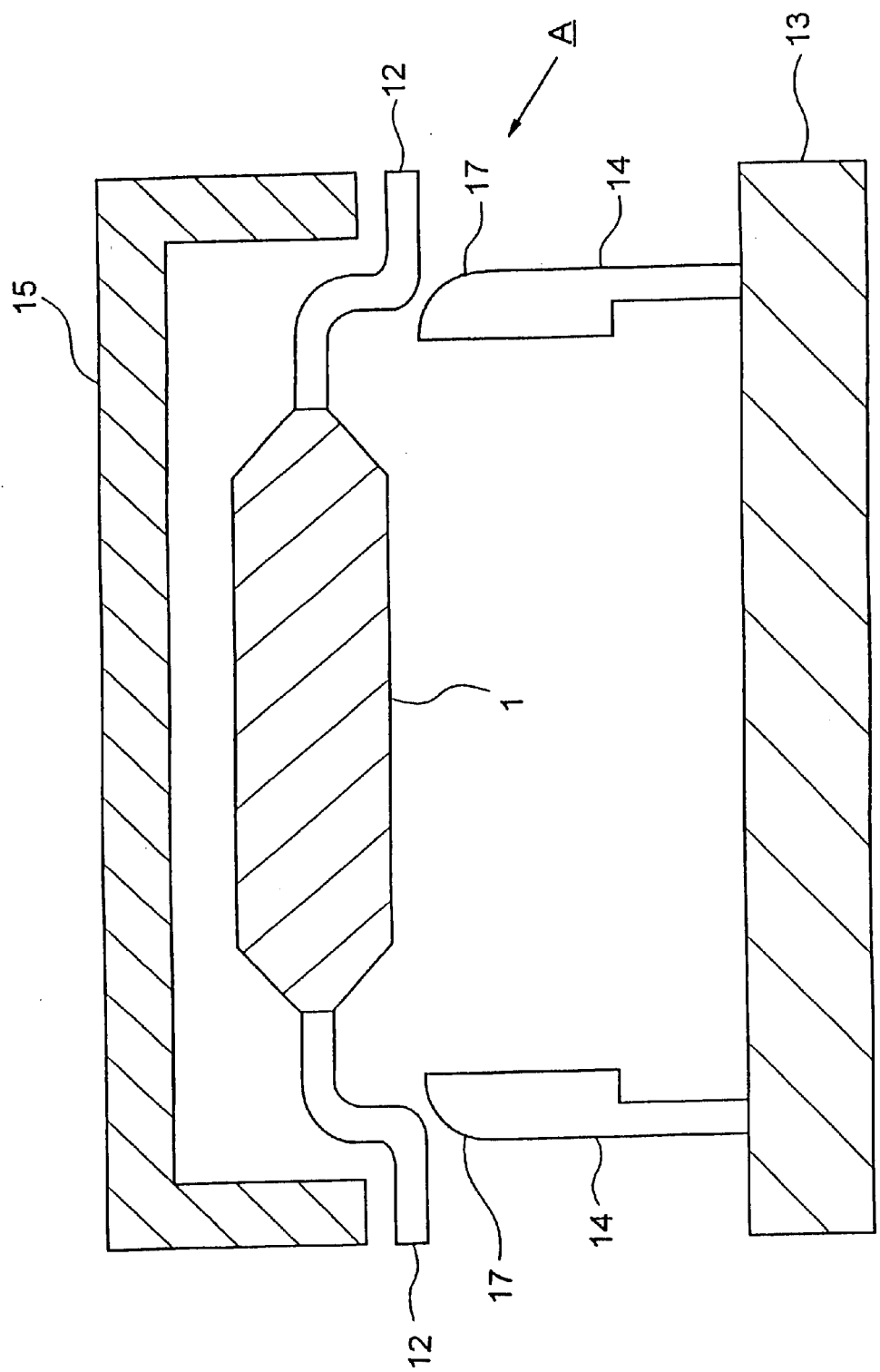
FIG. 1 is a sectional view of an IC socket according to an embodiment of the invention.
Figure 2:
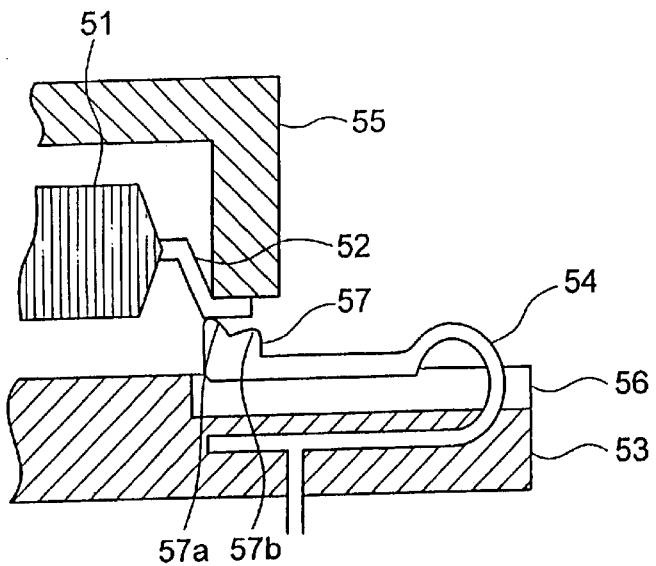
FIG. 2 is a sectional view of a conventional IC socket.
Figure 3:
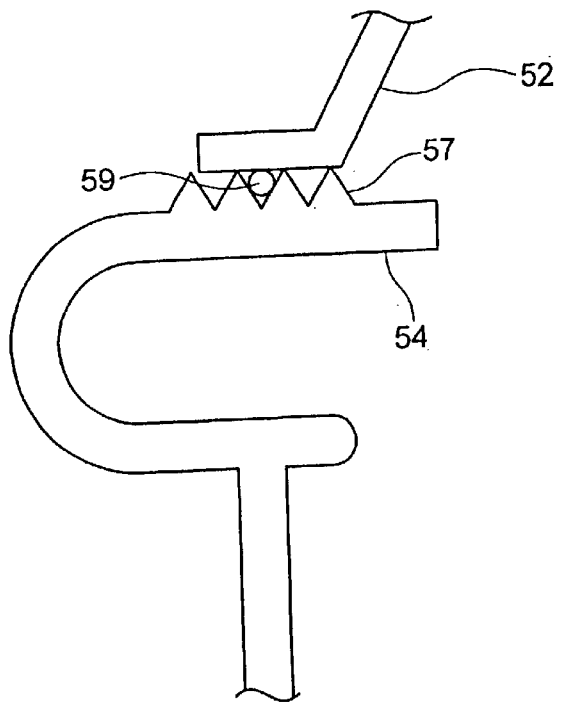
FIG. 3 is a side view of the contact pin of another conventional IC socket.

Embodiments of the invention will now be described with reference to the accompanying drawings.

In FIGS. 1 and 4–7, a semiconductor package 11 has a plurality of terminals 12 which are made of a metal such as aluminum, copper, brass, and an iron/nickel alloy. The semiconductor package 11 is of the surface mount type and made by soldering or bonding an IC or LSI chip (die) to a lead frame with the terminals 12 and then molding it with a resin or the like. The usual arrangements of the terminals 12 include small out-line package (SOP), single in-line package (SIP), dual in-line package (DIP), and quad flat package (QFP).

An IC socket body 13 is made of a dielectric material, such as a resin or ceramics, and has the corresponding number of contact pins 14 to the number of the terminals 12. Each contact pin 14 is made of a metal, such as steel, aluminum, copper, brass, or an iron/nickel alloy, and provided at a position corresponding to the position of each terminal 12 so that the contact portion 17 is brought into electrical contact with the terminal 52. A pressure member 15 is made of a dielectric material, such as a resin or ceramics, and pressed downwardly by a pressing device (not shown) so that the backside of the terminal 12 is pressed against the contact portion 17 of the contact pin 14.

The contact pins 14 of the socket body 13 are connected to measuring equipment (not shown) so that the contact portions 17, which are brought into contact with the terminals 12 of the semiconductor package 11, electrically connect the terminals 12 and the measuring equipment for measurement of the electrical characteristics of the semiconductor package 11. Such measurement of the electrical characteristics is made as the final or intermediate inspection or test of the semiconductor package 11 in the manufacturing process.

Figure 4:
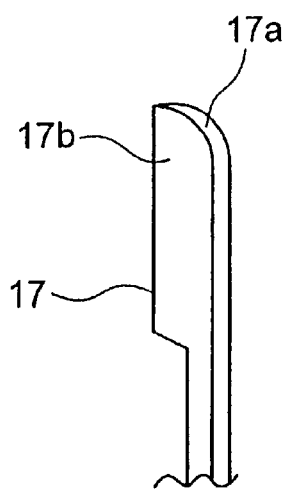
FIG. 4 is a perspective view of a contact portion of a contact pin for the IC socket of FIG. 1.
Figure 5:
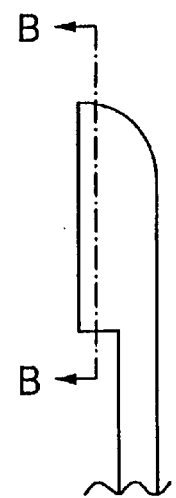
FIG. 5 is a side view of the contact portion of FIG. 4.
Figure 6:
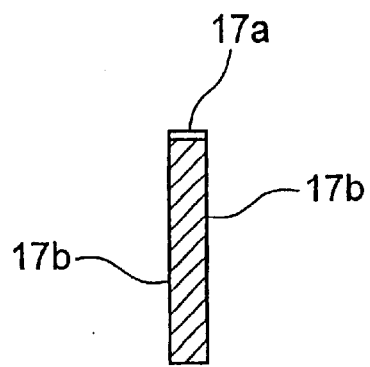
FIG. 6 is a sectional view taken along line B—B of FIG. 5.

As shown in FIGS. 4–6, each contact portion 17 is formed on the upper portion of a contact pin 14 so as to provide a contact face 17a made by rounding a rectangular face and a pair of side faces 17b on opposite sides of the contact face 17a. As shown in FIG. 1, each contact pin 14 is erected on the socket body 13 such that it is flexible toward the inside of the socket body 13.

Figure 7:
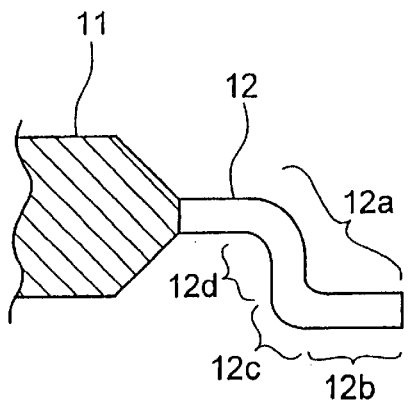
FIG. 7 is a side view of a terminal of a semiconductor package.

In FIG. 7, the terminal 12 of the semiconductor package 11 has such a shape as shown and usually solder plating for facilitating its mount on a printed circuit board or the like. The upper and lower horizontal faces 12a and 12b tend to collect dust particles, such as waste of the mold resin or filler, or dust, while the lower curved and vertical faces 12c and 12d collect relatively few dust particles. In addition, usually, an increasing amount of solder plating is applied toward the tip of the terminal 12 so that the amount of solder adhered to the lower curved and vertical faces 12c and 12d is less than that of the upper and lower horizontal faces 12a and 12b.

The operation of the IC socket will be described below.

Figure 8A:
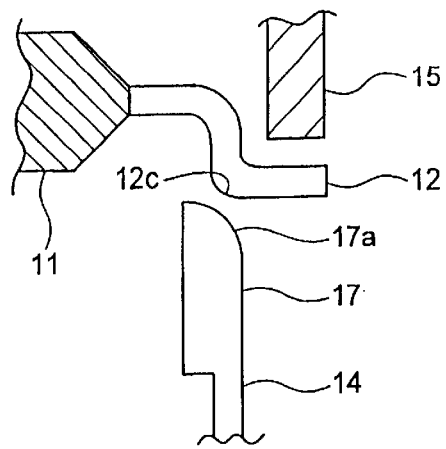
FIGS. 8(a)–(b) are sectional views of an area indicated by an arrow A in FIG. 1.

In FIG. 8(a), when the semiconductor package 11 is set in the IC socket, the lower curved face 12c of each terminal 12 is provided above the contact face 17a of the contact portion 17 for each contact pin 14.

Figure 8B:
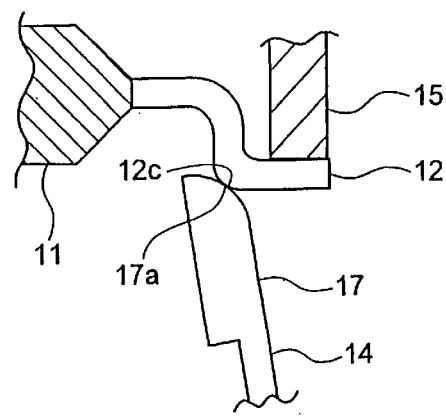

In FIG. 8(b), when the pressing member 15 is moved downwardly, the terminal 12 is pressed downwardly so that the lower curved face 12c is pressed against the contact face 17a of the contact portion 17. Since the contact face 17a is rounded, the vector force acting on the contact face 17a has a horizontal component. Consequently, the contact portion 17 is pushed to the left so that the contact pin 14 is flexed to the left.

Figure 9A:
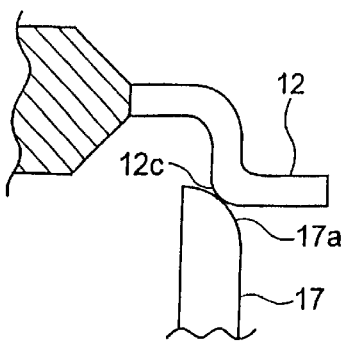
FIGS. 9(a)–(c) are sectional views of an area indicated by an arrow A in FIG. 1.
Figure 9B:
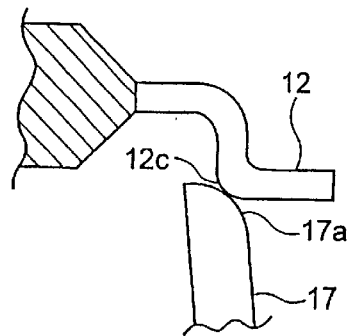
Figure 9C:
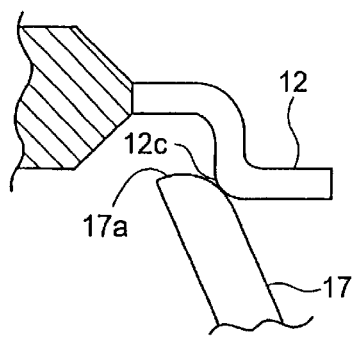

In FIGS. 9(a)–(c), as the terminal 12 is pressed and moved downwardly, the contact pin 14 is flexed to the left, and the contact face 17a of the contact portion 17 makes contact with only the lower curved face 12c of the terminal 12. Consequently, the lower curved face 12c is wiped by the contact face 17a so that the "solder" is removed from the lower curved face 12c. The area wiped by the contact face 17a is only a portion of the lower curved face 12c or a very small area.

The area of contact between the lower curved face 12c and the contact face 17a is as small as a point contact. As shown in FIG. 6, however, the contact face 17a has a thickness so that, more precisely, the area is as narrow as a line contact. The contact between the lower curved face 12c and the contact face 17a is kept by the spring force of the contact pin 14.

According to this embodiment, the area of the terminal 12 wiped by the contact face 17a of the contact pin 14 is only a portion of the lower curved face 12c and a very small area. In addition, the lower curved face 12c has a small amount of solder and collects few dust particles such as waste of the mold resin or filler, or dust. Consequently, the amount of "solder" removed by wiping is so small that the solder does not contaminate the surrounding atmosphere or accumulate to block electrical contact between the contact face 17a and the lower curved face 12c.

Since both the wiped area and the amount of removed solder are small, it is possible to increase the spring force of the contact pin 14 to provide a satisfactory contact pressure between the lower curved face 12c and the contact face 17a. Since the lower curved face 12c collects few dust particles, such as sticky waste of the mold resin or filler, or dust, the electrical contact between the contact face 17a and the lower curved face 12c is not blocked by the dust particles which are not removed by wiping.

The second embodiment of the invention will be described below. Like parts or components are given like reference numerals of the first embodiment and their description is omitted.

Figure 10:
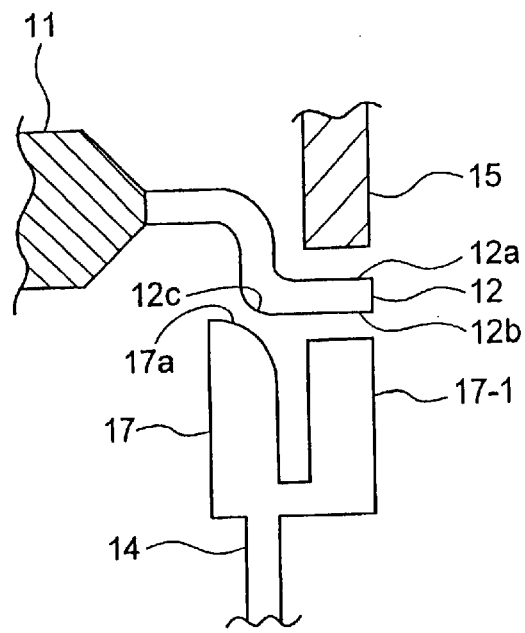
FIG. 10 is a side view of a contact pin of an IC socket according to a second embodiment of the invention.

In FIG. 10, the contact portion 17 of each contact pin 14 is provided with an integrally formed stopper portion 17-1. When the semiconductor package 11 is set in the IC socket so that the lower curved portion 12c of each terminal 12 is provided above the contact face 17a of the contact portion 17 for each contact pin 14, the terminal 12 is flanked by the stopper portion 17-1 and the pressing member 15. It is noted that the top face of the stopper portion 17-1 is made lower than the uppermost face of the contact portion 17.

When the pressing member 15 is moved downwardly, the terminal 12 is pressed downwardly so that the lower curved face 12c is pressed against the contact face 17a of the contact portion 17. As the terminal 12 is further pressed downwardly, the contact pin 14 is flexed to the left.

Since the lower curved face 12c receives an upward force from the contact face 17a and the front portion of the upper face 12 receives a downward force from the pressing member 15, the terminal 12 receives a bending moment. Consequently, the terminal 12 is bent in a clockwise direction at a point where it contacts the contact face 17a, moving the front portion downwardly.

When the terminal 12 is further pressed downwardly, the lower horizontal face 12b is brought into contact with the top face of the stopper portion 17-1 so that its further bending is prevented. The range of bending of the terminal 12 is controlled by adjusting the height of the top face of the stopper portion 17-1. The plastic deformation of the terminal 12 is prevented by keeping the above bending rage within the range of its elastic deformation.

According to this second embodiment, the contact portion 17 is provided with the integrally formed stopper portion 17-1, the top face of the stopper portion 17-1 is opposed to the bottom face of the pressing member 15, and the top face of the stopper portion 17-1 is made lower than the uppermost face of the contact portion 17. Consequently, the lower horizontal face 12b of the downwardly pressed terminal 12 is brought into contact with the top face of the stopper portion 17-1 to prevent further bending of the terminal 12. Thus, it is possible to control the range of bending of the terminal 12 by adjusting the height of the top face of the stopper portion 17-1. Accordingly, it is possible to prevent plastic deformation of the terminal 12 by keeping the bending rage of the terminal 12 within the range of its elastic deformation.

The third embodiment of the invention will be described below, wherein like components are given like reference numerals of the first and second embodiments and their description is omitted.

Figure 11:
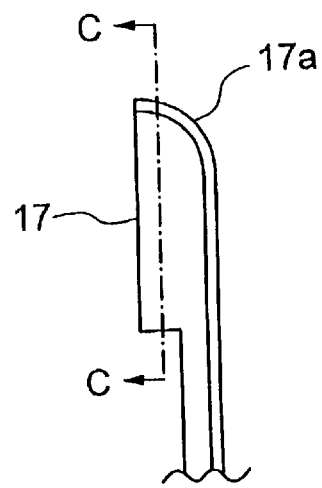
FIG. 11 is a side view of a contact pin of an IC socket according to a third embodiment of the invention.
Figure 12:
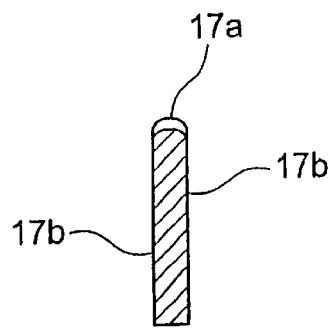
FIG. 12 is a sectional view taken along line C—C of FIG. 11.

In FIGS. 11 and 12, the contact portion 17 of each contact pin 14 is formed as shown by rounding a rectangular plate to provide a contact face 17a and a pair of side faces 17b. As best shown in FIG. 12, the contact face 17a is also rounded in the thicknesswise direction so that only the uppermost point of the contact face 17a makes contact with the lower curved face 12c of the terminal 12, thus minimizing the contact area as small as a point contact.

According to this third embodiment, the contact face 17a of the contact portion 17 is rounded also in the thicknesswise direction so that the contact area between the contact face 17a and the lower curved face 12c is as small as a point contact. Consequently, the wiping area on the terminal 12 is smaller than those of the first and second embodiments. Thus, the amount of wiped solder is smaller than those of the first and second embodiments, thus minimizing the atmospheric contamination by the scattered solder or the accumulation of the wiped solder on the contact face 17a, which otherwise blocks the electrical contact between the contact face 17a and the lower curved face 12c. The contact area between the contact face 17a and the lower curved face 12c is so small that it is possible to make the contact pressure per contact area satisfactorily high without increasing so much the spring force of the contact pin 14.

The fourth embodiment of the invention will be described below, wherein like components are given like reference numerals of the above embodiments and their description is omitted.

Figure 13:
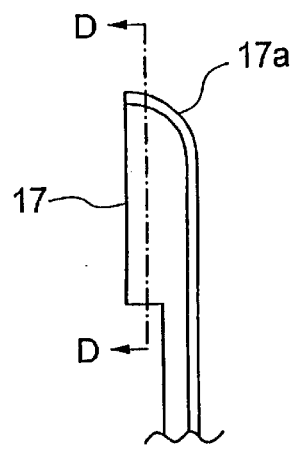
FIG. 13 is a side view of a contact pin of an IC socket according to a fourth embodiment of the invention.
Figure 14:
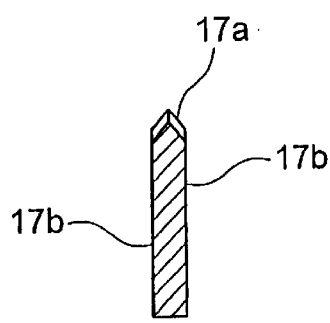
FIG. 14 is a sectional view taken along line D—D of FIG. 13.

In FIGS. 13 and 14, the contact portion 17 of each contact pin 14 has a contact face 17a made by rounding a rectangular plate in both widthwise and thicknesswise directions and a pair of side faces 17b. As best shown in FIG. 14, the contact face 17a is tapered in the thicknesswise direction so that only the uppermost portion of the contact face 17a makes contact with the lower curved face 12c of the terminal 12, thus minimizing the contact area as small as a point contact.

According to this fourth embodiment, the contact face 17a is tapered in the thicknesswise direction so that the contact area between the contact face 17a and the terminal 12 is as small as a point contact. Consequently, the wiped area of the terminal 12 is smaller than those of the first, second, and third embodiments. Thus, the amount of wiped solder is smaller than those of the first, second, and third embodiments, minimizing the atmospheric contamination by the scattered solder or the accumulation or wiped solder on the contact face 17a, which otherwise blocks the electrical contact between the contact face 17a and the lower curved face 12c. The contact area between the contact face 17a and the lower curved face 12c is so small that it is possible to make the contact pressure per contact area satisfactorily high without increasing so much the spring force of the contact pin 14.

It is noted that the present invention is not limited to the above illustrated embodiments but a variety of modifications are possible according to the spirit of the invention and included in the scope of the invention.

As has been described above, according to the invention, the IC socket comprises a socket body, a contact pin erected on the socket body and is flexible to the inside of the socket body, and a pressing member. The contact pin is provided with at the upper portion a contact portion which has a rectangular piece rounded for contact with the terminal of a semiconductor package. Only a portion of the rounded contact face contacts and wipes the lower face of the terminal and the wiped area is very small. In addition, the lower curved face has little solder plated and collects few dust particles such as wastes of the mold resin and filler or dust.

The amount of solder removed by wiping is so small that the removed solder does not contaminate the surrounding atmosphere or accumulate on the contact face to block an electrical contact between the contact face and the lower curved face. The small wiping area and the small amount of wiped solder make it possible to increase the spring force of the contact pin, thus providing a satisfactorily high contact pressure between the lower curved face and the contact face. The lower curved face collects few dust particles, such as wastes of sticky mold resin or filler, or dust, so that no dust particles prevent the establishment of a good electrical contact between the contact face and the lower curved face.

What is claimed is:

1. An IC socket for a semiconductor device having a package and at least one terminal extending outwardly from said package, said IC socket comprising:
   (a) a socket body;
   (b) at least one bar-type contact pin standing upright on said socket body and having a contact portion at a top end thereof, said contact pin being flexible toward a center of said socket body when said terminal of said semiconductor device presses said contact portion; and
   (c) a pressing member for pressing said terminal against said contact portion;
   (d) said contact portion having a contact face made by rounding a rectangular upper portion of said contact pin in a widthwise direction of said rectangular upper portion for contact with a lower curved face of said terminal of said semiconductor device.

2. An IC socket according to claim 1, wherein said contact face is rounded also in a thicknesswise direction of said rectangular upper portion, thus further minimizing an area of contact with said terminal of said semiconductor package.

3. An IC socket according to claim 1, wherein said contact face is tapered in a thicknesswise direction of said rectangular upper portion, thus further minimizing an area of contact with a terminal of a semiconductor package.

4. An IC socket according to claim 1, wherein said contact pin is provided with an integrally formed stopper portion to prevent excessive bending of said terminal of said semiconductor package.

5. An IC socket according to claim 4, wherein said stopper portion has a top face made lower than an uppermost face of said contact portion.

6. An IC socket for a semiconductor device having a package and at least one terminal extending outwardly from said package, said IC socket comprising:

(b) a socket body made of a dielectric material;

(b) at least one bar-type contact pin made of a metal strip and standing upright on said socket body such that it is flexible toward a center of said socket body when said terminal of said semiconductor device presses said contact pin; and (c) a contact face made by rounding a rectangular upper portion of said contact pin in a widthwise direction of said rectangular upper portion, thus minimizing an area of contact with a lower curved face of said terminal of said semiconductor device.

7. An IC socket according to claim 6, wherein said contact face is rounded also in a thicknesswise directions of said rectangular upper portion, thus further minimizing an area of contact with said terminal of said semiconductor package.

8. An IC socket according to claim 6, wherein said contact face is tapered in a thicknesswise direction of said rectangular upper portion, thus further minimizing an area of contact with said terminal of said semiconductor package.

9. An IC socket according to claim 6, wherein said contact pin is provided with an integrally formed stopper portion to prevent excessive bending of said terminal of said semiconductor package.

10. An IC socket according to claim 9, wherein said stopper portion has a top face made lower than an uppermost point of said contact face.

11. An IC socket according to claim 1, wherein said contact pins are disposed outside said package such that they make contact with said terminal of said semiconductor device.

12. An IC socket according to claim 6, wherein said contact pins are disposed outside said package such that they make contact with said terminal of said semiconductor device.

* * * * *